(12) United States Patent
Lee

(10) Patent No.: US 7,423,307 B2
(45) Date of Patent: Sep. 9, 2008

(54) CMOS IMAGE SENSOR AND METHOD FOR FABRICATING THE SAME

(75) Inventor: Sang Gi Lee, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/324,043

(22) Filed: Dec. 29, 2005

(65) Prior Publication Data

US 2006/0145224 A1 Jul. 6, 2006

(30) Foreign Application Priority Data

Dec. 30, 2004 (KR) .................. 10-2004-0117181

(51) Int. Cl.
*H01L 31/062* (2006.01)

(52) U.S. Cl. .................. 257/294; 257/291; 257/432; 257/E31.12; 257/E21.252; 257/E27.132; 438/70

(58) Field of Classification Search .................. 257/294, 257/291, 432; 432/70; 359/619
See application file for complete search history.

(56) References Cited

U.S. PATENT DOCUMENTS

| | | | |
|---|---|---|---|
| 4,722,910 A | 2/1988 | Yasaitis | |
| 5,162,887 A | 11/1992 | Dierschke | |
| 5,494,857 A | 2/1996 | Cooperman et al. | |
| 6,055,460 A | 4/2000 | Shopbell | |
| 6,128,091 A * | 10/2000 | Uchida et al. | ................ 356/432 |
| 6,187,684 B1 | 2/2001 | Farber | |
| 6,379,992 B2 * | 4/2002 | Jo | ................ 438/70 |
| 6,414,343 B1 | 7/2002 | Kondo et al. | |
| 6,746,933 B1 | 6/2004 | Beintner et al. | |
| 6,875,558 B1 | 4/2005 | Gaillard et al. | |
| 7,279,353 B2 * | 10/2007 | Rhodes | ................ 438/70 |
| 2006/0056034 A1 * | 3/2006 | Tsuruma | ................ 359/626 |
| 2006/0073623 A1 * | 4/2006 | Conley et al. | ................ 438/22 |
| 2006/0086957 A1 * | 4/2006 | Kang | ................ 257/292 |

FOREIGN PATENT DOCUMENTS

JP 08-148665 A 6/1996

(Continued)

OTHER PUBLICATIONS

Stanley Wolf Ph.D.; Chapter 2, Isolation Technologies for Integrated Circuits; Silicon Processing for the VLSI Era, vol. 2: Process Integration; Copyright 1990; Lattice Press, Sunset Beach, CA.

(Continued)

*Primary Examiner*—Ahmed Sefer
(74) *Attorney, Agent, or Firm*—Andrew D. Fortney

(57) ABSTRACT

Provided are a CMOS image sensor in which microlenses are formed in a remaining space in a patterned light shielding layer to improve image sensor characteristics and to protect the microlenses during packaging, and a method of fabricating the same. The CMOS image sensor may include: a semiconductor substrate; at least one photodiode on or in the semiconductor substrate; a first insulating layer on the substrate including the photodiode(s); a plurality of metal lines on and/or in the first insulating layer; a second insulating layer on the first insulating layer including at least some of the metal lines; a patterned light shielding layer on the second insulating layer; and microlenses in a remaining space on the second insulating layer.

14 Claims, 5 Drawing Sheets

FOREIGN PATENT DOCUMENTS

| | | | |
|---|---|---|---|
| JP | 09-222505 A | | 8/1997 |
| JP | 2001-68658 | * | 3/2001 |
| KR | 0165376 | | 9/1998 |

OTHER PUBLICATIONS

People's Republic of China Office Action; Application No. 2005-10097115.8; Dated: Nov. 23, 2007; State Intellectual Property Office of People's Republic of China; People's Republic of China.

Otani Tomohiko; Device Having Microlens and Shape of Microlens; Patent Abstracts of Japan; Publication No. 09-222505; Publication Date: Aug. 26, 1997; Japan.

Nakano Takashi and Teranishi Shinichi; Solid Image Pickup Element; Patent Abstracts of Japan; Publication No. 08-148665; Publication Date: Jun. 7, 1996; Japan.

* cited by examiner

CMOS IMAGE SENSOR AND METHOD FOR FABRICATING THE SAME

This application claims the benefit of the Korean Patent Application No. 10-2004-0117181, filed on Dec. 30, 2004, which is hereby incorporated by reference as if fully set forth herein.

BACKGROUND OF THE INVENTION

1. Field of the Invention

The present invention relates to a CMOS image sensor and a method of fabricating the same, and more particularly, to a CMOS image sensor in which light shielding layers are formed between microlenses to improve reflection characteristics and to protect the microlenses upon packaging, and a method of fabricating the same.

2. Discussion of the Related Art

Generally, an image sensor is a semiconductor device that converts an optical image to an electric signal. In a CCD (charge coupled device) image sensor, a plurality of MOS (metal-oxide-metal) capacitors are arranged close to one another to transfer and store electric charge carriers. In a CMOS (complementary MOS) image sensor, a plurality of MOS transistors corresponding to the number of pixels are fabricated by CMOS technology. CMOS image sensors also typically include a control circuit and a signal processing circuit as peripheral circuits and a switching system that detects outputs of photosensors such as photodiodes step by step using the MOS transistors.

Hereinafter, a CMOS image sensor and a method of fabricating the same according to the related art will be described in detail with reference to FIG. 1 of the attached drawings, which shows a cross-sectional view illustrating a CMOS image sensor according to the related art.

A plurality of photodiodes 11 are formed on a semiconductor substrate 10, and first insulating layers 12 and metal lines 13 are alternately formed on the semiconductor substrate 10 including the photodiodes 11 in plural. (For clarity, interfaces between adjacent insulator layers in the first insulating layers 12 are not shown.) Then, a second insulating layer 14 including an oxide layer is formed on the first insulating layer 12 and planarized. A light shielding material is formed and patterned on the second insulating layer 14 to form a patterned light shielding layer 15. Then, in order to protect the patterned light shielding layer 15, a third insulating layer 16 (e.g., an oxide layer or a nitride layer) is formed on the light shielding layer 15 and planarized. The planarization typically uses a chemical mechanical polishing (CMP) method. Then, microlenses 17 are formed on the third insulating layer 16 between the light shielding layers 15. As shown in FIG. 1, the microlenses 17 partially overlap the ends of the light shielding layers 15.

The CMOS image sensor and the method of fabricating the same according to the related art have the following problems. In the case of using the light shielding layer, since the method forms a planarized insulating layer for protecting the light shielding layer and for providing a planar surface for subsequent formation of microlenses, the number of steps increases and thus manufacturing efficiency decreases. Also, since the packaging process is performed after the microlenses are formed (and, in some cases, while the microlenses are exposed), protecting the microlenses during packaging can be difficult and/or unnecessarily complex.

SUMMARY OF THE INVENTION

Accordingly, the present invention is directed to a CMOS image sensor and a method for fabricating the same that substantially obviates one or more problems due to limitations and disadvantages of the related art.

An object of the present invention is to provide a CMOS image sensor and a method for fabricating the same in which light-shielding layers are formed between microlenses to improve reflection characteristics and to protect the microlenses during packaging.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure(s) and process step(s) and/or condition(s) particularly pointed out in the written description and claims hereof as well as the appended drawings.

To achieve these objects and other advantages and in accordance with the purpose of the invention, as embodied and broadly described herein, a CMOS image sensor according to an aspect of the present invention may include a semiconductor substrate, a plurality of photodiodes on the semiconductor substrate, a first insulating layer on the substrate including the photodiodes, one or more metal interconnections on and/or in the first insulating layer, a second insulating layer on the first insulating layer including the metal interconnection, a patterned light shielding layer on the second insulating layer, and microlenses in a remaining space on the second insulating layer.

Preferably, the light shielding layer pattern corresponds to the metal interconnection(s), the patterned light shielding layer and the microlenses do not overlap each other, and/or the patterned light shielding layer has at least the same thickness as that of the microlenses.

In another aspect of the present invention, a method for fabricating a CMOS image sensor may include forming a plurality of photodiodes on a semiconductor substrate, forming a first insulating layer on the substrate including the photodiodes, forming one or more metal interconnections on and/or in the first insulating layer, forming a second insulating layer on the first insulating layer including the metal interconnection(s), forming a patterned light shielding layer on the second insulating layer, and forming microlenses in a remaining space on the second insulating layer.

Preferably, the step of forming the microlenses may further include forming a microlens material on the second insulating layer including the light shielding layers, planarizing the microlens material, and forming the microlenses by performing a bake process. Also, the step of planarizing the microlens material may include etching and/or selectively etching the microlens material.

Preferably, after planarization, the microlens material has a thickness equal to or less than that of the light shielding layer.

Preferably, the light shielding layer pattern corresponds to the metal interconnection(s), and/or the patterned light shielding layer and the microlenses do not overlap each other.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2a to 2g are cross-sectional views illustrating a method of fabricating a CMOS image sensor according to the present invention.

Figure 1:
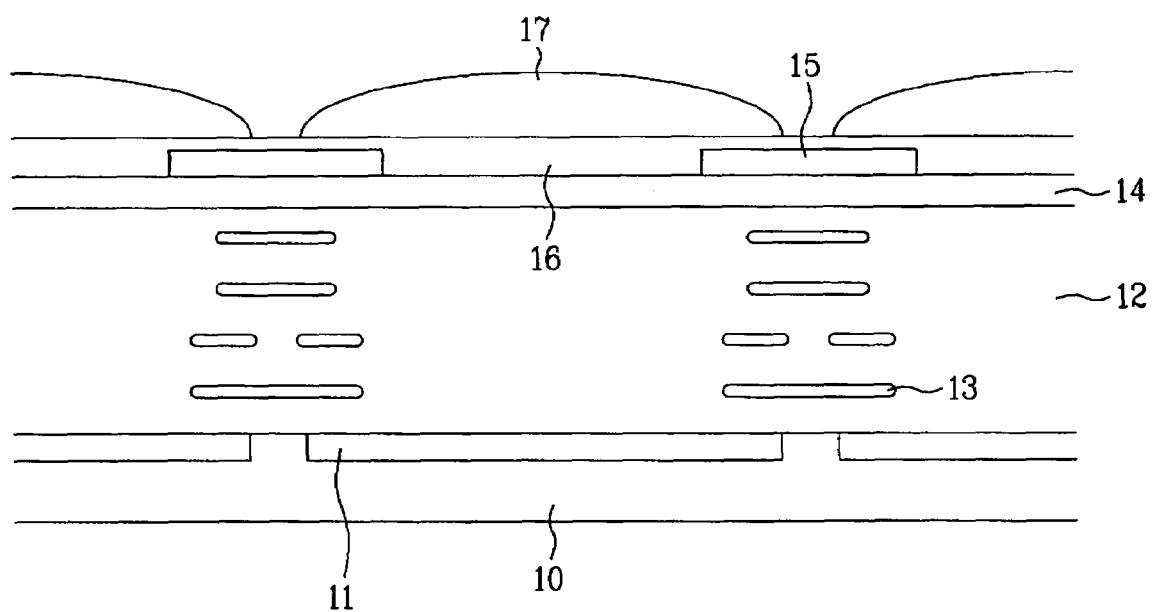
FIG. 1 is a cross-sectional view illustrating a CMOS image sensor according to the related art.
Figure 2A:
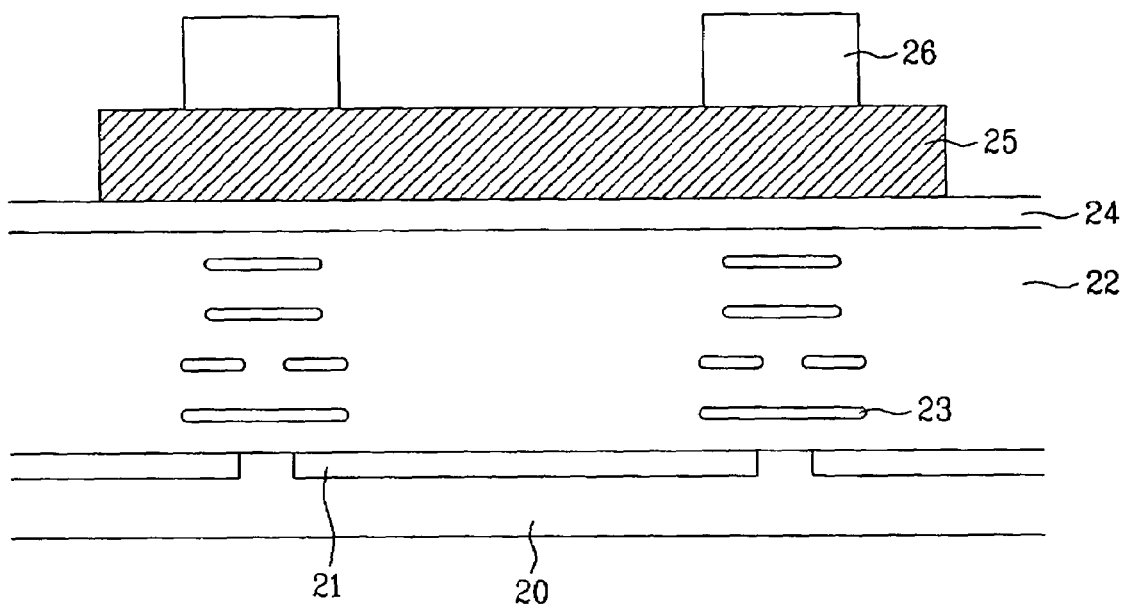
FIGS. 2a to 2g are cross-sectional views illustrating a method of fabricating a CMOS image sensor according to the present invention.

As illustrated in FIG. 2a, a plurality of photodiodes 21 are formed on a semiconductor substrate 20, and one or more first insulating layers 22 and metal lines (or interconnections) 23 are alternately formed on the semiconductor substrate 20 including the photodiodes 21 in plural. After an uppermost metal line is formed, a second insulating layer 24 comprising an oxide layer and/or a nitride layer is formed on the first insulating layer 22 and the uppermost metal line, and the second insulating layer 24 is planarized. The planarization generally comprises chemical mechanical polishing (CMP). Then, a light shielding layer material 25 is formed on the second insulating layer 24. Although a discontinuous light shielding layer material 25 is shown, a continuous light shielding layer material 25 may be formed by known blanket deposition techniques. Generally, light shielding layer material 25 comprises a material that is opaque to visible light (e.g., a black material or a material containing a black substance such as carbon, graphite or $CrO_3$). Then, after a photoresist is coated on the light shielding layer material 25 and exposed and developed using a microlens mask, the photoresist on the microlens regions is removed to form a photoresist pattern 26.

Figure 2B:
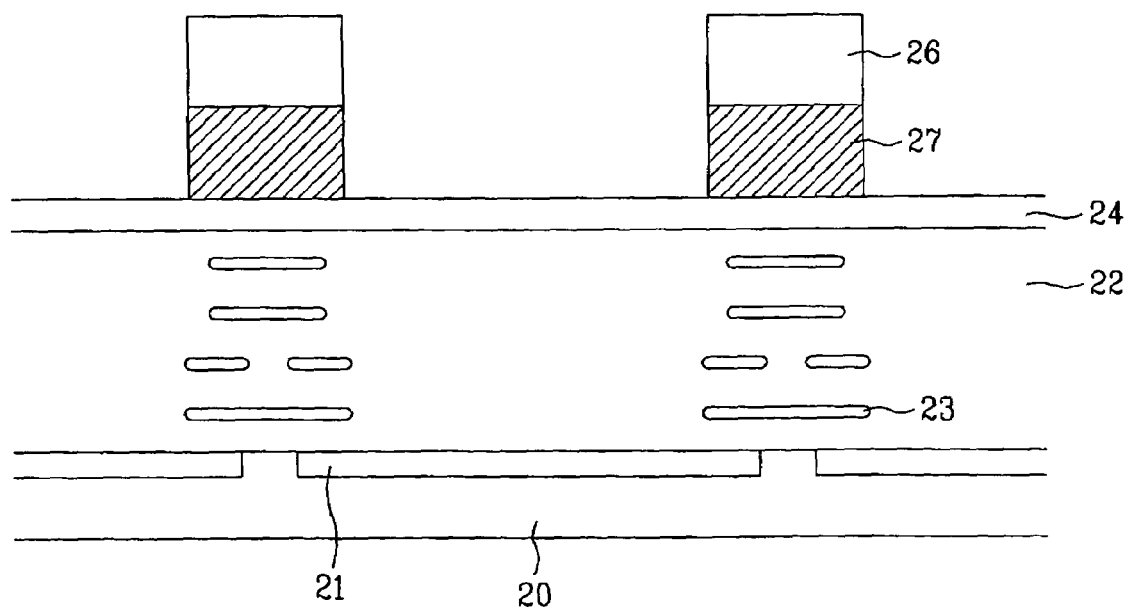

As illustrated in FIG. 2b, the light shielding layer material 25 is etched using the photoresist pattern 26 as a mask to form patterned light shielding layer 27.

Figure 2C:
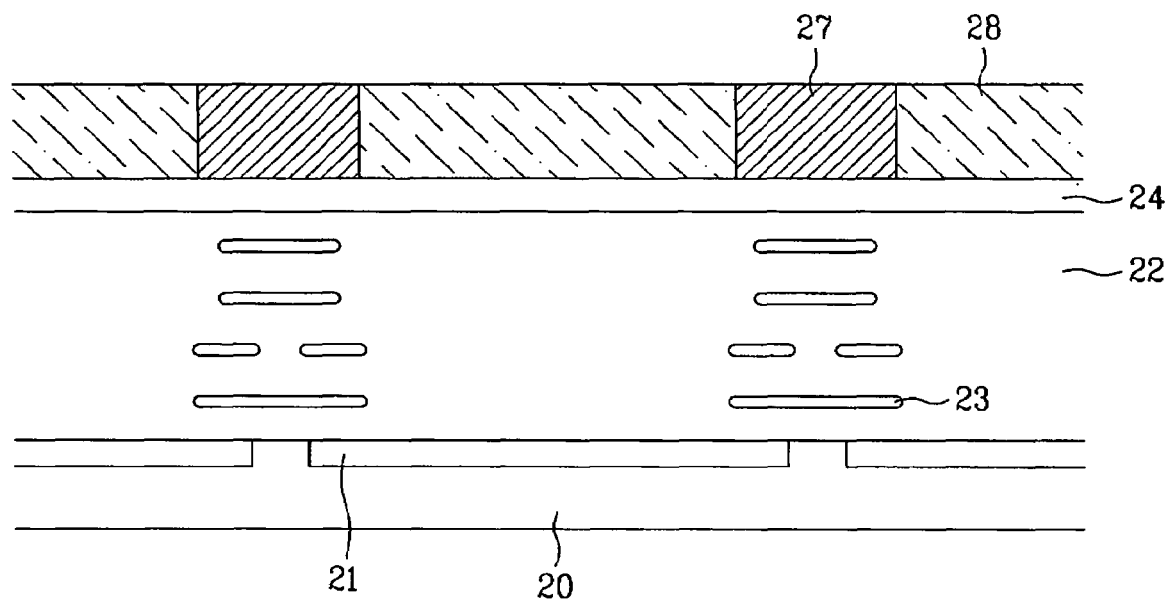

As illustrated in FIG. 2c, the photoresist pattern 26 is removed, a microlens material is formed on the patterned light shielding layer 27 and the second insulating layer 24 and is planarized using a CMP or etchback method to form a microlens layer (comprising, e.g., a plurality of microlens bodies 28) in the remaining space on the second insulating layer 24 not occupied by the patterned light shielding layer 27 (e.g., between lines or other structures in the light shielding layer pattern 27). At this time, the deposited microlens material has a thickness greater than that of the microlens, in consideration of the amount of material removed during planarization.

Preferably, the microlens bodies 28 have a thickness equal to or less than the thickness of the patterned light shielding layer 27. Such a configuration may facilitate protecting the microlenses during the packaging process.

Figure 2D:
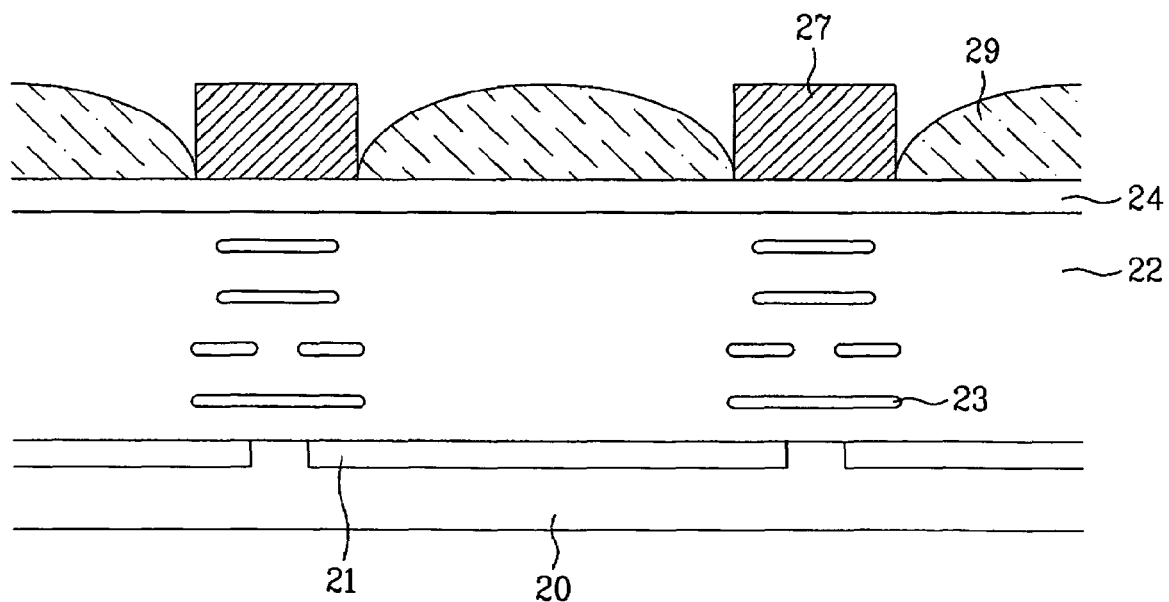

As illustrated in FIG. 2d, the microlens bodies 28 are baked at a predetermined temperature to form microlenses 29.

Figure 2E:
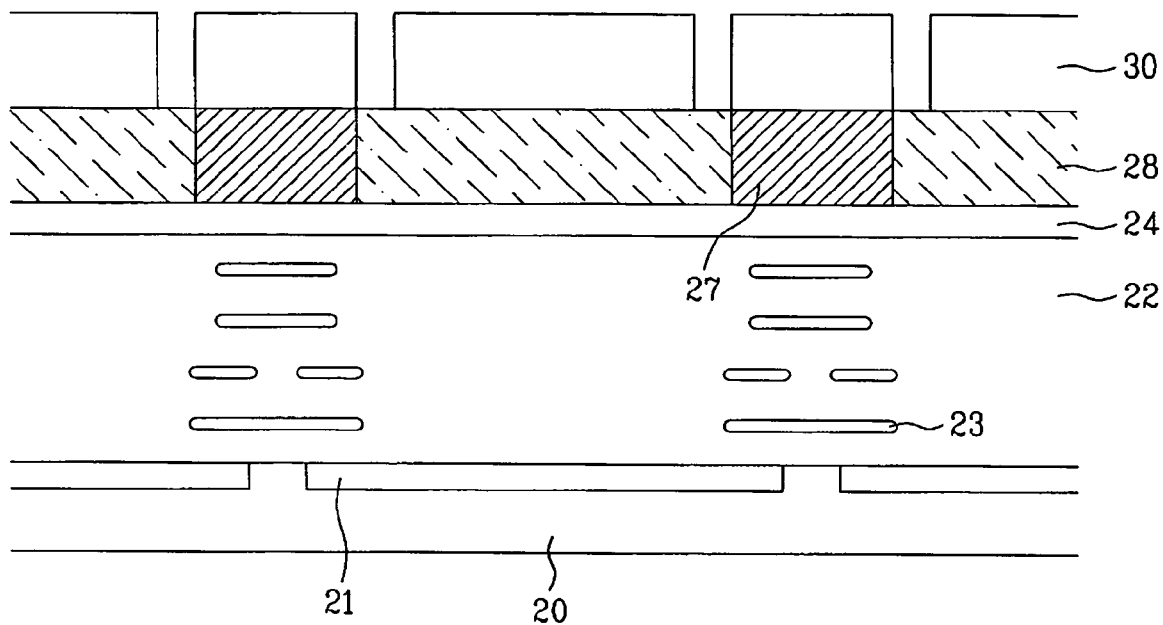

Meanwhile, in a further embodiment, the microlenses may be formed by selectively etching the microlens material 28. Particularly, as illustrated in FIG. 2e, a photoresist pattern 30 (generally comprising photoresist pattern 26 and a further "microlens body" pattern over microlens bodies 28) is formed on the microlens material 28 to expose predetermined peripheral portion(s) of the microlens material 28.

Figure 2F:
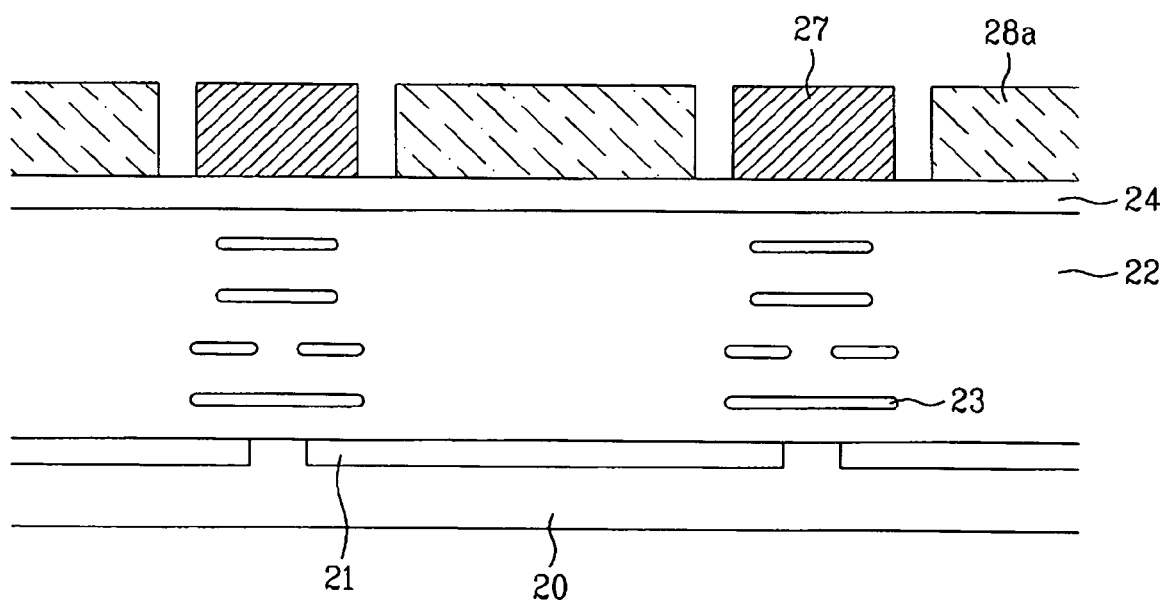

Subsequently, as illustrated in FIG. 2f, the microlens material 28 is selectively etched using the photoresist pattern 30 as mask and the photoresist pattern 30 is removed to form patterned microlens bodies 28a.

Figure 2G:
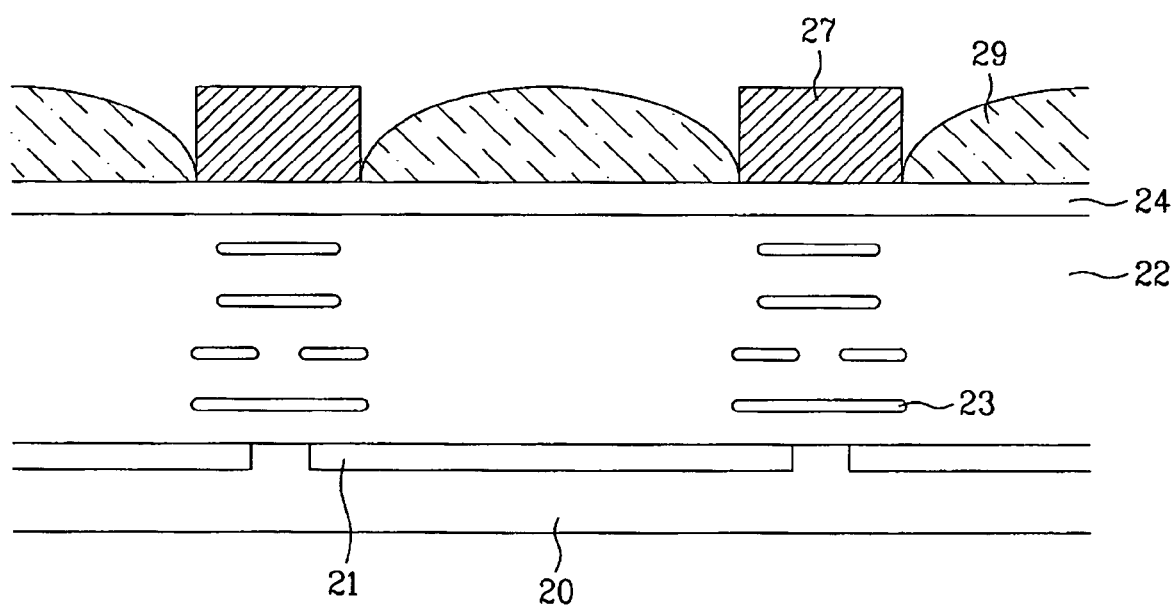

As illustrated in FIG. 2g, the patterned microlens bodies 28a are baked at a predetermined temperature to form microlenses 29.

According to the present invention, since the microlenses are formed in a remaining space in a patterned light shielding layer, optionally in a self aligned manner, the microlenses are generally well-aligned, and the space for the microlenses can be easily ensured. In addition, since the light shielding layer is between the microlenses, light efficiency can increase (e.g., using characteristic light transmission through the microlenses and reflection from the metal lines.

Furthermore, since the microlenses may have a thickness equal to or less than thickness of the light shielding layer, the microlenses can be protected during packaging, and thus yield and production can be improved.

What is claimed is:

1. A method of fabricating a CMOS image sensor comprising:
    forming a patterned light shielding layer comprising a plurality of light shielding structures on a planarized insulating layer, the planarized insulating layer on an underlying insulating layer having a plurality of metal lines thereon and/or therein, the underlying insulating layer on a semiconductor substrate including a plurality of photodiodes;
    forming a microlens material on the planarized insulating layer and the patterned light shielding layer;
    planarizing the microlens material by polishing, such that the planarized microlens material has a thickness substantially equal to that of the light shielding layer; and
    baking the planarized microlens material to form microlenses on the planarized insulating layer between the light shielding structures.

2. the method according to claim 1, wherein the patterned light shielding layer and the microlenses do not overlap each other.

3. The method according to claim 1, further comprising the step of:
    selectively etching the planarized microlens material before the step of baking the planarized microlens material.

4. The method according to claim 3, wherein a peripheral portion of the planarized microlens material is selectively etched.

5. The method according to claim 3, wherein the light shielding layer comprises at least one of carbon, graphite, or $CrO_3$.

6. The method according to claim 3, wherein the planarized insulating layer comprises an oxide layer.

7. The method according to claim 3, wherein the planarized insulating layer comprises a nitride layer.

8. The method according to claim 3, wherein planarizing the planarized insulating layer comprises chemical mechanical polishing (CMP).

9. The method according to claim 3, wherein polishing comprises chemical mechanical polishing (CMP).

10. The method according to claim 1, wherein the light shielding layer comprises at least one of carbon, graphite, or $CrO_3$.

11. The method according to claim 1, wherein the planarized insulating layer comprises an oxide layer.

12. The method according to claim 1, wherein the planarized insulating layer comprises a nitride layer.

13. The method according to claim 1, wherein planarizing the planarized insulating layer comprises chemical mechanical polishing (CMP).

14. The method according to claim 1, wherein polishing comprises chemical mechanical polishing (CMP).

* * * * *